US009742391B2

(12) United States Patent
Moghe et al.

(10) Patent No.: US 9,742,391 B2
(45) Date of Patent: Aug. 22, 2017

(54) SINGLE-CHIP MULTI-DOMAIN GALVANIC ISOLATION DEVICE AND METHOD

(71) Applicant: The Silanna Group Pty Ltd, Eight Mile Plains, Queensland (AU)

(72) Inventors: Yashodhan Vijay Moghe, Marsfield (AU); Andrew Terry, Picton (AU)

(73) Assignee: The Silanna Group PTY LTD, Queensland (AU)

( * ) Notice: Subject to any disclaimer, the term of this patent is extended or adjusted under 35 U.S.C. 154(b) by 94 days.

(21) Appl. No.: 14/395,474

(22) PCT Filed: Apr. 17, 2013

(86) PCT No.: PCT/AU2013/000403
§ 371 (c)(1),
(2) Date: Oct. 17, 2014

(87) PCT Pub. No.: WO2013/155565
PCT Pub. Date: Oct. 24, 2013

(65) Prior Publication Data
US 2015/0070073 A1    Mar. 12, 2015

Related U.S. Application Data

(60) Provisional application No. 61/635,251, filed on Apr. 18, 2012.

(51) Int. Cl.
| | | |
|---|---|---|
| *H03M 1/12* | (2006.01) | |
| *H03M 1/66* | (2006.01) | |
| *H01F 19/04* | (2006.01) | |
| *H01L 21/762* | (2006.01) | |

(Continued)

(52) U.S. Cl.
CPC ........... *H03K 17/161* (2013.01); *H01F 19/04* (2013.01); *H01L 21/762* (2013.01);
(Continued)

(58) Field of Classification Search
CPC ....... H01F 19/00; H01L 21/00; H01L 21/762; H01L 21/76264; H01L 21/76838;
(Continued)

(56) References Cited

U.S. PATENT DOCUMENTS 6,407,432 B1   6/2002  Nemoto et al.
7,288,940 B2  10/2007  Wynne et al.
(Continued)

FOREIGN PATENT DOCUMENTS

| EP | 1229586 A2 | 8/2002 | |
| JP | EP 1229586 A2 * | 8/2002 | ......... H01L 27/1203 |
| WO | 2012/065229 A1 | 5/2012 | |

OTHER PUBLICATIONS

International Search Report for PCT/AU2013/000403 dated Aug. 6, 2013.
(Continued)

*Primary Examiner* — Lincoln Donovan
*Assistant Examiner* — David Mattison
(74) *Attorney, Agent, or Firm* — Nixon Peabody LLP; Jeffrey L. Costellia

(57) ABSTRACT

An integrated circuit, including:
at least three integrated circuit portions mutually spaced on a single electrically insulating die, the integrated circuit portions being mutually galvanically isolated; and
signal coupling structures on the die to allow communication of signals between the integrated circuit portions while maintaining the galvanic isolation therebetween.

23 Claims, 14 Drawing Sheets

(51) Int. Cl.

| | | |
|---|---|---|
| *H01L 23/538* | (2006.01) | |
| *H03K 17/16* | (2006.01) | |
| *H03M 1/08* | (2006.01) | |
| *H01L 27/02* | (2006.01) | |
| *H01L 23/522* | (2006.01) | |
| *H01L 21/768* | (2006.01) | |
| *H01L 29/06* | (2006.01) | |
| *H04J 3/04* | (2006.01) | |

(52) U.S. Cl.
CPC .. *H01L 21/76264* (2013.01); *H01L 21/76838* (2013.01); *H01L 23/5227* (2013.01); *H01L 23/538* (2013.01); *H01L 27/0203* (2013.01); *H01L 29/0649* (2013.01); *H03M 1/0827* (2013.01); *H04J 3/047* (2013.01); *H01L 2224/49171* (2013.01); *H01L 2924/1305* (2013.01); *H01L 2924/13062* (2013.01); *H03M 1/12* (2013.01); *H03M 1/66* (2013.01)

(58) Field of Classification Search
CPC ....... H01L 2224/00; H01L 2224/49171; H01L 23/00; H01L 23/5227; H01L 23/538; H01L 27/00; H01L 27/0203; H01L 29/00; H01L 29/0649; H01L 2924/00; H01L 2924/1305; H01L 2924/13062; H03K 17/00; H03K 17/0822; H03K 17/161; H03K 17/162
USPC .......... 327/379; 257/506; 370/535; 438/598, 438/622
See application file for complete search history.

(56) References Cited

U.S. PATENT DOCUMENTS

| | | | |
|---|---|---|---|
| 7,737,871 | B2 | 6/2010 | Leung et al. |
| 2003/0235929 | A1 | 12/2003 | Cowles et al. |
| 2008/0267301 | A1 | 10/2008 | Alfano et al. |
| 2008/0311862 | A1* | 12/2008 | Spina ................ H01Q 1/38 455/78 |
| 2009/0027243 | A1* | 1/2009 | Leung ................ H01L 23/48 341/100 |
| 2009/0213914 | A1 | 8/2009 | Dong et al. |
| 2010/0052826 | A1 | 3/2010 | Callahan et al. |
| 2011/0095620 | A1* | 4/2011 | Fouquet ............. H01F 19/08 307/104 |
| 2011/0254123 | A1 | 10/2011 | Sellathamby et al. |
| 2013/0062725 | A1* | 3/2013 | Hopper .............. H01L 23/5227 257/506 |
| 2014/0145301 | A1 | 5/2014 | Moghe et al. |

OTHER PUBLICATIONS

International Preliminary Report on Patentability for PCT/AU2013/000403 dated Oct. 30, 2014.
Culurciello, E., et al., "A Monolithic Isolation Amplifier in Silicon-on-Insulator CMOS," IEEE International Symposium on Circuits and Systems ISCAS 2005, May 23-26, 2005, pp. 137-140, vol. 1.
Extended Search Report for European Patent Application No. 13778241.3 dated Dec. 21, 2015.

* cited by examiner

SINGLE-CHIP MULTI-DOMAIN GALVANIC ISOLATION DEVICE AND METHOD

RELATED APPLICATIONS

The present application is the national phase of International Application No. PCT/AU2013/000403, filed on Apr. 17, 2013, which claims the benefit of priority to U.S. Provisional Application No. 61/635,251, filed on Apr. 18, 2012, and the disclosures of which are hereby incorporated herein by reference in their entireties.

TECHNICAL FIELD

The present invention relates to a single-chip multi-domain galvanic isolation device and method of producing same.

BACKGROUND

The transmission of signals across an electrical isolation barrier is important for many applications, including the following:
Mains connected medical equipment (for patient safety)
Communications links across cables between mains connected equipment (to avoid ground loops). Examples are USB, Firewire, Ethernet etc.
Isolating telecommunications equipment from phone lines (for lightning strike protection)
Mains data networks (for mains power isolation)
Precision audio, sensing and data acquisition (to suppress noise pickup)
Industrial sensing and control (for isolation of various power domains)
Automotive circuits (for protection from high voltage electrical spikes)

Traditionally, optical isolation using optocouplers has been used for these purposes. However, optocouplers can support only relatively low data rates (~10 Mbps) and consume a lot of power (>10 mW). In view of such shortcomings, electronics manufacturers are increasingly introducing other forms of digital isolators, based on a variety of technologies, including transformer (inductive), capacitive, and Giant Magnetoresistance (GMR) coupling.

It is desired to provide an integrated circuit and a method of producing an integrated circuit that alleviate one or more difficulties of the prior art, or that at least provide a useful alternative.

SUMMARY

In accordance with some embodiments of the present invention, there is provided an integrated circuit, including:
at least three integrated circuit portions mutually spaced on a single electrically insulating die, the integrated circuit portions being mutually galvanically isolated; and signal coupling structures on the die to allow communication of signals between the integrated circuit portions while maintaining the galvanic isolation therebetween.

In some embodiments, each of the integrated circuit portions is directly coupled to each of the other integrated circuit portions via a corresponding set of said signal coupling structures and a corresponding dedicated set of interconnect paths.

In some other embodiments, each of the integrated circuit portions is directly coupled to each of the other integrated circuit portions via a corresponding dedicated set of said signal coupling structures and a common set of interconnect paths shared by the other integrated circuit portions.

In some yet further embodiments, each of the integrated circuit portions is directly coupled to up to two of the other integrated circuit portions via respective dedicated sets of said signal coupling structures and respective dedicated sets of interconnect paths to form a chain or ring of isolated integrated circuit portions.

In some embodiments, the integrated circuit portions include at least two of:
(i) first integrated circuit portions directly coupled to each of a plurality of other first ones of the integrated circuit portions via a corresponding set of said signal coupling structures and a corresponding dedicated set of interconnect paths; and
(ii) second integrated circuit portions directly coupled to each of a plurality of other second ones of the integrated circuit portions via a corresponding dedicated set of said signal coupling structures and a common set of interconnect paths shared by the other second ones of the integrated circuit portions; and
(iii) third integrated circuit portions directly coupled to each of a plurality of other third ones of the integrated circuit portions via a corresponding dedicated set of said signal coupling structures and a common set of interconnect paths shared by the other third ones of the integrated circuit portions.

In some embodiments, the integrated circuit portions include all three of (i), (ii), and (iii).

In some embodiments, the integrated circuit includes a demultiplexer having one input and a plurality of outputs corresponding to ones of said integrated circuit portions, each of said outputs being galvanically isolated from the input and the other outputs.

In some embodiments, the integrated circuit includes a multiplexer configured having one output and a plurality of inputs corresponding to ones of said integrated circuit portions, each of said inputs being galvanically isolated from the output and the other inputs.

In accordance with some embodiments of the present invention, there is provided an integrated circuit for isolated switching, including:
integrated circuit portions mutually spaced on a single electrically insulating die, the integrated circuit portions being mutually galvanically isolated; and
signal coupling structures on the die to allow communication of signals between the integrated circuit portions while maintaining the galvanic isolation therebetween;
wherein the integrated circuit portions include at least one control integrated circuit portion configured to apply an oscillating differential signal to a corresponding one of the signal coupling structures, depending on the state of a corresponding input signal; and
the integrated circuit portions include at least one switching integrated circuit portion configured to receive the oscillating differential signal via the corresponding coupling structure, to rectify the oscillating differential signal, and to selectively apply the rectified signal, or a signal derived therefrom, to a corresponding gate connection of at least one corresponding transistor such that terminals of the at least one corresponding transistor can be selectively interconnected based on the state of the corresponding input signal.

In accordance with some embodiments of the present invention, there is provided an integrated circuit for isolated switching, including:

integrated circuit portions mutually spaced on a single electrically insulating die, the integrated circuit portions being mutually galvanically isolated; and signal coupling structures on the die to allow communication of signals between the integrated circuit portions while maintaining the galvanic isolation therebetween;

wherein the integrated circuit portions include at least one control integrated circuit portion configured to apply an oscillating differential signal to a corresponding first of the signal coupling structures, and an input signal to a corresponding second of the signal coupling structures; and the integrated circuit portions include at least one switching integrated circuit portion configured to receive the oscillating differential signal via the first corresponding coupling structure, and to rectify the oscillating differential signal to provide a local floating supply rail; and the switching integrated circuit portion is configured to receive the corresponding input signal via the corresponding second coupling structure, to convert the corresponding input signal to a corresponding digital control signal on the local floating supply rail, and to selectively apply the corresponding digital control signal to a gate connection of at least one corresponding transistor such that terminals of the at least one corresponding transistor can be selectively interconnected based on the state of the corresponding input signal.

In some embodiments, the at least one switching integrated circuit portion is configured to rectify the oscillating differential signal to generate positive and negative local floating supply rails; and the switching integrated circuit portion is configured to selectively convert one of the local floating supply rails to the corresponding digital control signal based on the corresponding input signal.

In some embodiments, a plurality of mutually isolated switching integrated circuit portions are communicatively coupled to a common control integrated circuit portion to form a bank of isolated switches or relays with a common control interface. In some embodiments, at least two of the switches share a common connection.

In some embodiments, the integrated circuit portions and signal coupling structures are configured to provide an M×N isolated crossbar switch.

In some embodiments, the integrated circuit portions and signal coupling structures are configured to provide a high potential domain/low potential domain switch or gate driver under control of signals input to a digital control domain. In some embodiments, the low potential domain and the digital control domain are mutually isolated. In some embodiments, the low potential side and the digital control domain are the same.

In some embodiments, the signal coupling structures include capacitive signal coupling structures. In some embodiments, the signal coupling structures include inductive signal coupling structures. In some embodiments, the signal coupling structures include GMR signal coupling structures.

In accordance with some embodiments of the present invention, there is provided a method of producing an integrated circuit, including:

forming or receiving an electrically insulating substrate having a plurality of layers thereon, the layers including metal and dielectric layers and at least one semiconductor layer;

patterning at least some of the layers to form at least three mutually galvanically isolated integrated circuit portions mutually spaced on the substrate and signal coupling structures to couple signals between the otherwise mutually galvanically isolated integrated circuit portions.

In accordance with some embodiments of the present invention, there is provided a method of producing an integrated circuit for isolated switching, including:

forming or receiving an electrically insulating substrate having a plurality of layers thereon, the layers including metal and dielectric layers and at least one semiconductor layer;

patterning at least some of the layers to form at least three mutually galvanically isolated integrated circuit portions mutually spaced on the substrate and signal coupling structures to couple signals between the otherwise mutually galvanically isolated integrated circuit portions.

wherein the integrated circuit portions include at least one control integrated circuit portion configured to apply an oscillating differential signal to a corresponding one of the signal coupling structures, depending on the state of a corresponding input signal; and the integrated circuit portions include at least one switching integrated circuit portion configured to receive the oscillating differential signal via the corresponding signal coupling structure, to rectify the oscillating differential signal, and to selectively apply the rectified signal, or a signal derived therefrom, to a corresponding gate connection of at least one corresponding transistor such that terminals of the at least one corresponding transistor can be selectively interconnected based on the state of the corresponding input signal.

In accordance with some embodiments of the present invention, there is provided a method of producing an integrated circuit for isolated switching, including:

forming or receiving an electrically insulating substrate having a plurality of layers thereon, the layers including metal and dielectric layers and at least one semiconductor layer;

patterning at least some of the layers to form more than two mutually galvanically isolated integrated circuit portions mutually spaced on the substrate and signal coupling structures to couple signals between the otherwise mutually galvanically isolated integrated circuit portions;

wherein the integrated circuit portions include at least one control integrated circuit portion configured to apply an oscillating differential signal to a corresponding first of the signal coupling structures, and an input signal to a corresponding second of the signal coupling structures; and the integrated circuit portions include at least one switching integrated circuit portion configured to receive the oscillating differential signal via the first corresponding signal coupling structure, and to rectify the oscillating differential signal to provide a local floating supply rail; and the switching integrated circuit portion is configured to receive the corresponding input signal via the corresponding second signal coupling structure, to convert the corresponding input signal to a corresponding digital control signal on the local floating supply rail, and to selectively apply the corresponding digital control signal to the gate connection of at least one corresponding transistor such that terminals of the at least one corresponding transistor can be selectively interconnected based on the state of the corresponding input signal.

BRIEF DESCRIPTION OF THE DRAWINGS

Some embodiments of the present invention are hereinafter described, by way of example only, with reference to the accompanying drawings, wherein.

DETAILED DESCRIPTION

Figure 1:
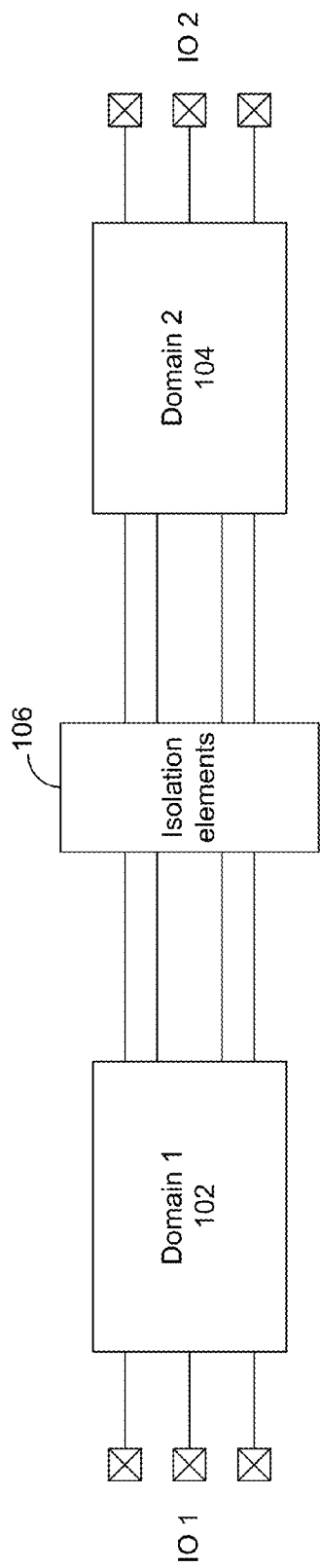
FIG. 1 is a schematic block diagram illustrating the fundamental components of a high-voltage isolator.

The basic structure of a galvanic isolation device is illustrated in FIG. 1, consisting of a first (galvanic) domain or circuit block 102 communicating with a second (galvanic) domain or circuit block 104 via an 'isolation interface' having one or more isolation and signal coupling elements 106. The isolation and signal coupling elements 106 maintain the galvanic isolation between the two domains 102, 104 while nevertheless allowing useful signals to be communicated between the two domains 102, 104 across the isolation interface. (Throughout this specification, the term 'domains' should be understood as referring to mutually isolated galvanic domains; that is, the domains are mutually isolated in a galvanic sense in that they do not have a common or shared ground plane.)

The type of communication across the isolation interface can include one or more of the following:

(i) Uni or bi-directional AC or DC power (the latter via rectification of an AC signal);
(ii) Uni or bi-directional analog communication; and
(iii) Uni or bi-directional digital communication.

The signal coupling elements 106 can take many forms, including capacitive, inductive (transformer), and Giant MagnetoResistance (GMR) coupling elements. Capacitive and magnetic coupling elements are suitable for communicating power and data, while GMR coupling elements can only communicate data.

Prior art isolation devices are formed from multiple dies (also sometimes referred to as 'chips'), where the first domain 102 and the second domain 104 are on physically separate dies mounted within a single package. However, new forms of isolation devices have been developed recently, in which the galvanically isolated domains are formed on the same die or substrate. Such devices are described in U.S. Patent Application No. 61/415,281 and corresponding International Patent Application No. PCT/AU2011/001497, entitled Single-Chip Integrated Circuit With Capacitive Isolation ("the single-die isolator patent applications"), and the entire contents of both patent applications are hereby expressly incorporated herein by reference.

Additional to these new single die isolation devices, the inventors have determined that it would be advantageous to provide more than two mutually isolated galvanic domains on a single die. To date, even multi-chip isolator devices have been limited to only two mutually isolated domains, possibly due in part to the prohibitive complexity of a multi-die assembly. However, the inventors have determined that it would be advantageous to allow communication between three or more mutually isolated domains in a single device for a variety of applications, including compact, isolated high-side/low-side drivers, banks of isolated solid-state relays or switches, and isolated multiplexers, amongst others.

Accordingly, described herein are single-die isolation devices, each having three or more mutually galvanically isolated domains and enabling communication between those domains. The device configurations and methods described herein allow multi-domain isolation devices to be produced at lower cost and size and higher levels of integration than would be possible if multiple dies were used. Forming isolators on a single die rather than on a multi-die assembly results in lower manufacturing costs and reduced operational power consumption. Also described herein are various forms of switching devices based on such isolators.

Multiple Isolated Domains on a Single Die

Each of the devices described herein is an integrated circuit with at least three mutually galvanically isolated domains on a single electrically insulating die. The term "insulating die" as used in this specification refers to a single die or 'chip' in which it is possible, as a minimum, to galvanically isolate regions on the die from each other, such regions being mutually spaced in plain view.

Such dies fall into two categories:

Dies having an active semiconductor layer that is 'naturally' divided into isolated regions during wafer processing. Examples include thin-epi silicon-on-insulator (SOI) and silicon-on-sapphire (SOS) dies; and Dies having an active semiconductor layer that is normally continuous at the end of wafer processing, such as thick-epi SOI dies. In these cases, the active semiconductor layer can be divided into isolated islands by adding some form of trench isolation into the wafer processing flow. Examples of trench isolation techniques include:

Extra deep field oxidation; and

Reactive ion etching followed by oxide deposition.

Except where otherwise clear from the context, the above also applies to the term "insulating substrate", with the term "substrate" replacing the term "die".

Figure 13:
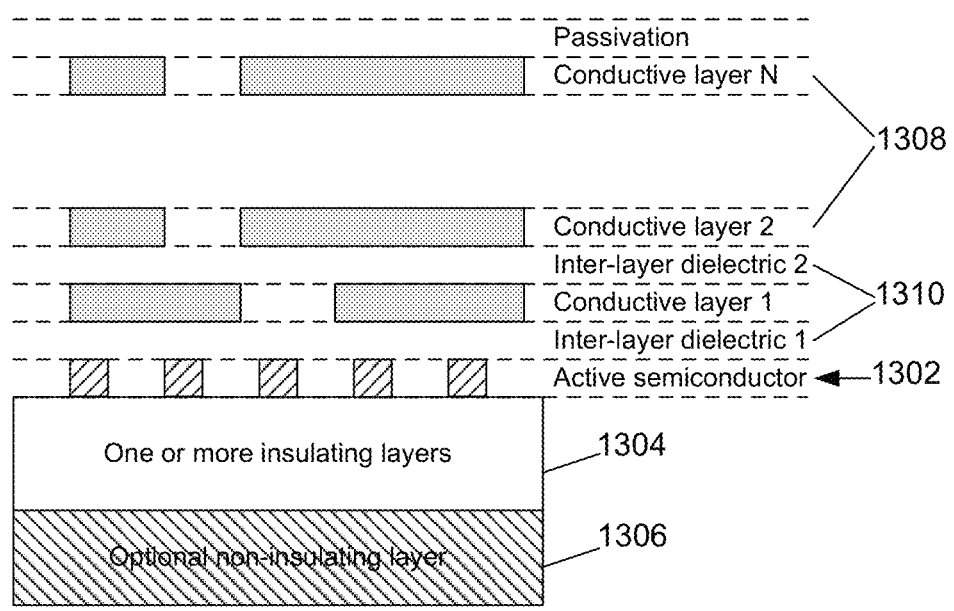
FIG. 13 is a schematic cross-sectional side view of an insulating die with mutually isolated active semiconductor areas on an insulating substrate, with overlying conductive and ILD layers.

For example, FIG. 13 is a schematic cross-sectional view of a die having galvanically isolated active semiconductor regions 1302 disposed on top of a substrate includes one or more insulating layers 1304, the semiconductor regions 1302 being 'naturally' isolated as part of the standard processing. Optionally, the stackup may have a non-insulating layer 1306 at the bottom, often acting as a handle layer, such as when devices are formed from a 'thin-epi' SOI wafer. Alternatively, devices can be formed from wafers or substrates without a non-insulating layer on the bottom, such as:

(i) SOI, where the silicon handle wafer is removed
(ii) SOS
(iii) Silicon on diamond
(iv) Silicon on aluminium nitride
(v) Silicon on various insulating layers The stackup above the active semiconductor layer 1302 typically includes a number of conductive layers (e.g., polysilicon and/or metal layers) 1308 separated by inter-layer dielectrics (e.g., oxides, nitrides, polyimides etc.) 1310. The stackup may be formed entirely as part of core semiconductor process (as is the case traditionally). Alternatively, part of the stackup may be formed in wafer post-processing steps after the processed wafer leaves the foundry. In some embodiments, the stackup may be formed by wafer bonding techniques.

Figure 14:
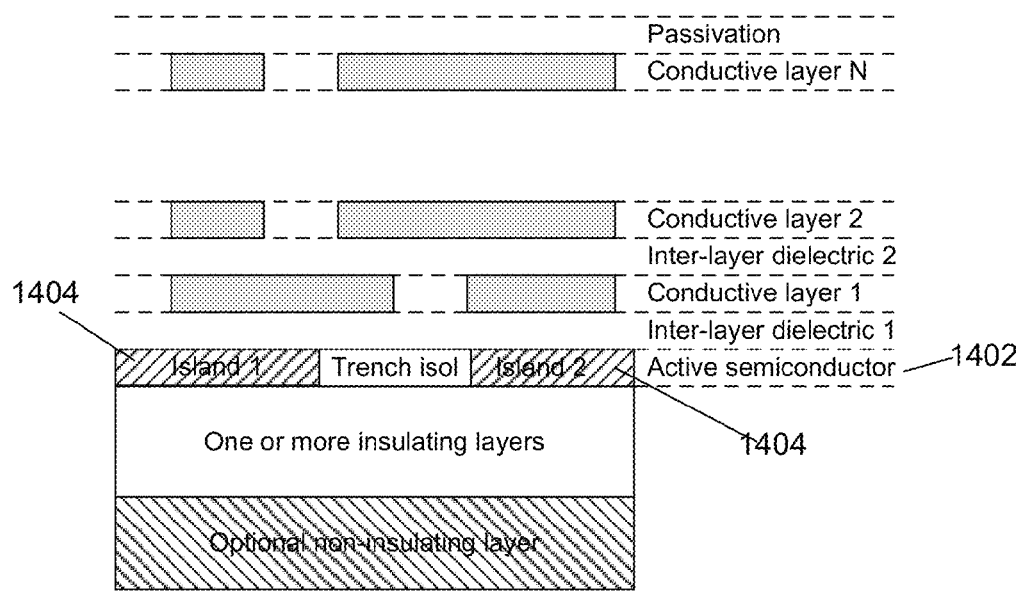
FIGS. 14 and 15 are schematic cross-sectional side and plan views, respectively, of an insulating die where the active semiconductor area has been divided into islands by the use of trench isolation.
Figure 15:
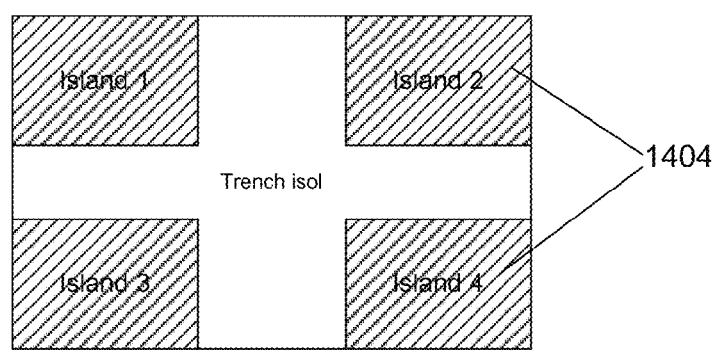

FIGS. 14 and 15 are schematic cross-section and plan views, respectively, of a processed die where the active semiconductor layer 1402 is divided into islands 1404 by trench isolation. It should be noted that, after trench isolation, this structure is generally equivalent to that shown in FIG. 13.

As will be apparent to those skilled in the art, the stackups shown in FIGS. 13 and 14 can alternatively be formed using wafer bonding and post-processing techniques known to those skilled in the art. Further details of insulating substrate dies are provided in the single-die isolator patent applications.

Since the die layers under the active layer 1404 and is electrically insulating, the islands 1404 constitute isolated entities or supply domains. The only limitations on the number of isolated domains that can be formed on a single die are due to limitations on the available die area and the minimum distance between isolated pins on the package (i.e., breakdown through the air between package pins respectively connected to mutually isolated domains).

As described above, different types of signal coupling (e.g., capacitive, inductive, or GMR) can be used to couple otherwise mutually isolated galvanic domains in order to allow signals to be communicated between the domains while maintaining their mutual galvanic isolation. Suitable signal coupling structures can be formed using the metal, semiconductor and dielectric layer stack formed as part of standard CMOS processing, in some cases involving additional post-processing steps (including wafer bonding in some cases).

Figure 16:
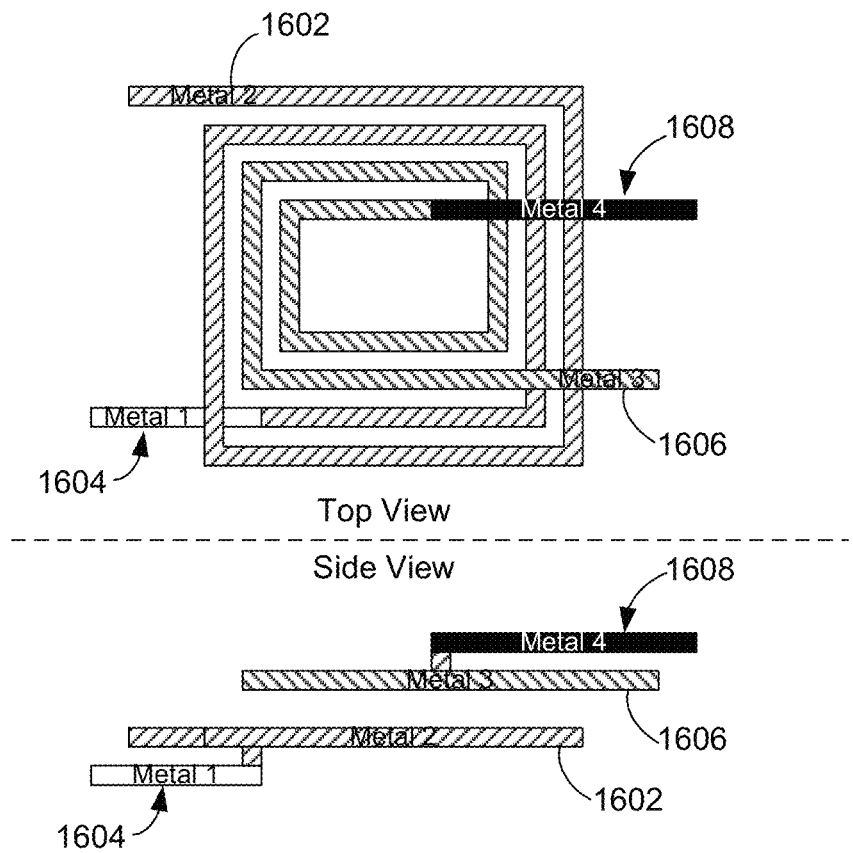
FIG. 16 includes schematic plan and cross-sectional side views, respectively, of an inductive (transformer) signal coupling structure.

Details of capacitive coupling structures are described in the single-die isolator patent applications. FIG. 16 includes schematic plan and side views of an on-chip inductive coupling structure formed from the layer stack. A first coil 1602 includes a flat spiral made from the Metal 2 layer with a small pass-under portion 1604 made from Metal 1 layer. A second coil 1606 includes a flat spiral made from the Metal 3 layer with a pass-over portion 1608 made from the Metal 4 layer. In this embodiment, the two coils are coaxial, but it will be understood by those skilled in the art that any arrangement of conductors that provides magnetic coupling (magnetic field linkage) between two otherwise galvanically isolated circuit elements can be used, including coplanar coils and/or single and multi-turn coils, and that ferromagnetic materials can be incorporated. Inductive coupling can also be used to transmit power or data across an isolation barrier.

Figure 17:
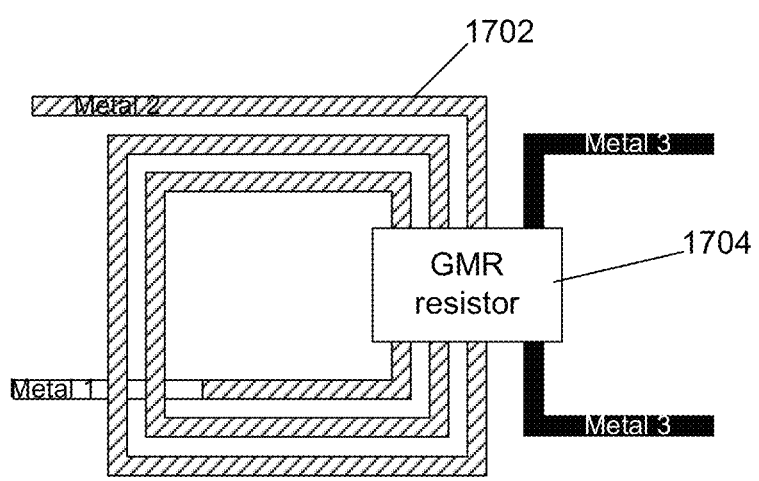
FIG. 17 is a schematic plan view of a GMR signal coupling structure.

FIG. 17 is a schematic plan view of a GMR coupling structure, including a spiral coil driver 1702 placed in close proximity to (but galvanically isolated from) a magnetically sensitive resistive element 1704 formed using standard methods known to those skilled in the art. The coil driver 1702 alters the magnetic field within the magnetically sensitive resistor 1704, thus altering its resistance value. This change is resistance is used to convey information across the galvanic isolation barrier. However, GMR isolators typically cannot transmit useful power because the received signals are very weak. As will be known by those skilled in the art, there are several forms of GMR isolator, including the use of differential and Wheatstone bridge configurations to improve signal detection.

There are many different communication topologies that allow communication between multiple domains, including:

(i) between each pair of isolated domains (pair-wise);
(ii) via common isolated nodes (common-line);
(iii) in a chain or ring (daisy-chain);
(iv) one-to-many or many-to-one; and
(v) combinations of the above e.g. multiple daisy chains, M-to-N arrangements, etc.

Figure 2:
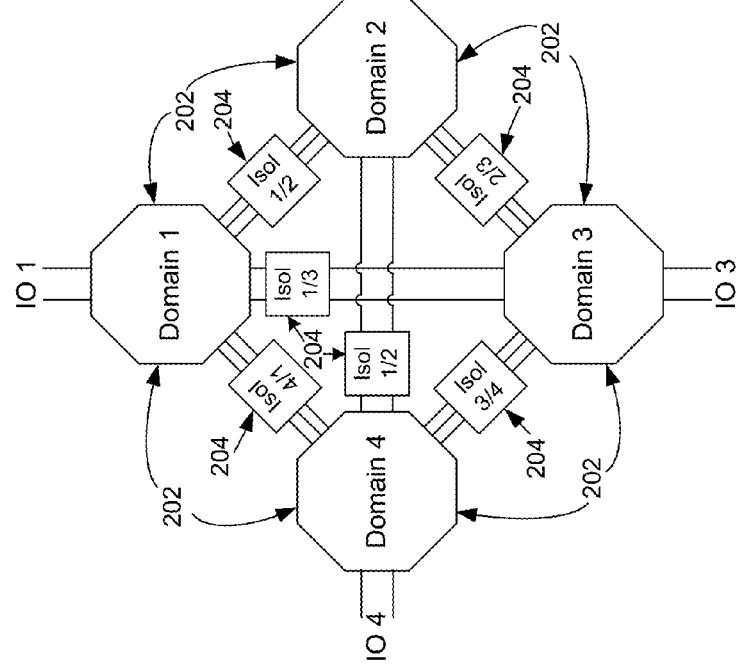

For example, FIG. 2 shows schematically an isolation device that provides pair-wise communication between four otherwise isolated domains 202 on a single chip or die, wherein each pair of communicating domains has a corresponding dedicated set of signal coupling elements 204. In this and any of the other devices described herein, the signal coupling elements 204 may be of any suitable form, including inductive (transformer) or GMR coupling structures, or capacitive coupling structures including those described in the single-die isolator patent applications. Also, in this and any of the other devices described herein, each "set" of communication channels between domains includes at least two signal coupling elements/structures to couple respective differential signal channels between isolated domains (for example, in these Figures each set of communication channels is shown as having three signal channels). Although the signal coupling elements/structures of each "set" between a corresponding pair of domains are typically of the same coupling type (e.g., capacitive, inductive, or GMR), this need not be the case in other embodiments.

The IOs (inputs and outputs) 206 of such a chip can be arranged, for example, on the four sides of the die package to allow for maximum spacing of the exposed pins. Although the device of FIG. 2 includes four mutually isolated domains, it should be understood that this device topology can be readily modified to provide any practical number of mutually isolated galvanic domains in excess of two.

Figure 3:
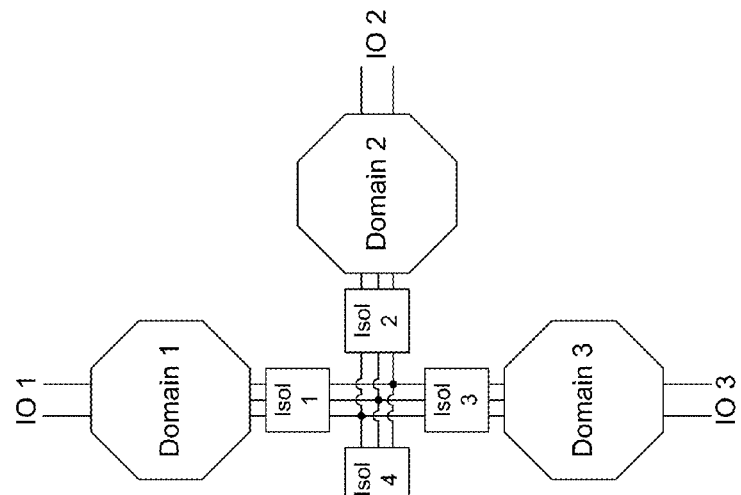
FIGS. 2 to 6 are schematic block diagrams illustrating respective galvanic domain interconnection topologies for providing for mutually galvanically isolated communicating domains on a single chip or die in accordance with embodiments of the present invention.

FIG. 3 shows an isolation device using a common-line communication topology (once again, four domains are shown in the illustrated embodiment, but it will be apparent that any practical number can be provided in other embodiments), whereby each domain is connected via a corresponding set of signal coupling elements to a set of common communication lines. Relative to the general device topology shown in FIG. 2, this arrangement reduces the total number of signal coupling elements required, which can significantly reduce the corresponding die area.

Figure 5:
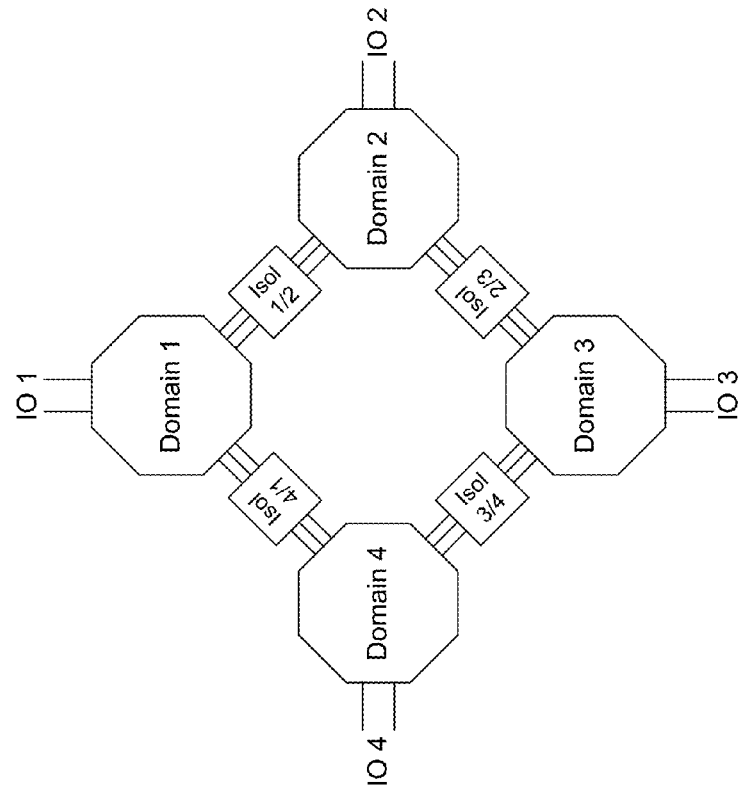
Figure 4:
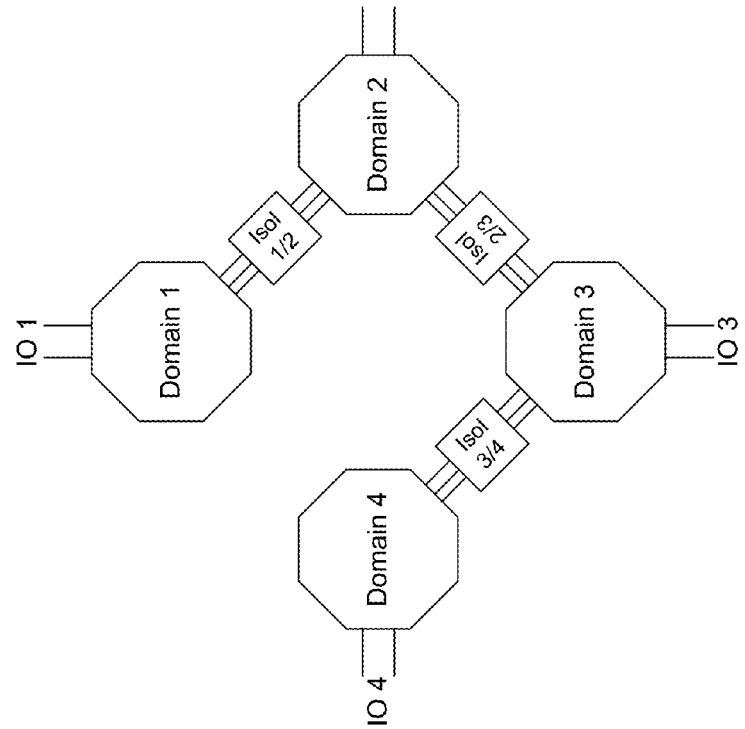

FIGS. 4 and 5 show isolation devices having linear and ring interconnection topologies respectively (once again, four domains are shown, but any practical number can be provided), whereby each domain communicates directly only with one or two neighbouring domains via sets of signal coupling elements. Such topologies are known in the art as 'daisy chain' and 'daisy chain ring' configurations, respectively. Communication between non-neighbouring domains is achieved by passing power and/or data from neighbour to neighbour. In the ring arrangement of FIG. 5, communication between domains of the ring may be in either or both of clockwise and anti-clockwise directions around the ring. Relative to the general device topology shown in FIG. 2, the daisy chain communication topologies of FIGS. 4 and 5 reduce the number of signal coupling elements required. Moreover, unlike the topologies shown in FIGS. 2 and 3, the daisy chain and daisy chain ring topologies do not require the sets of non-neighbouring signal paths to cross over each other in a planar single-die arrangement. This is advantageous for manufacturing processes where the vertical thickness of inter-metal dielectrics is insufficient to stand off the required isolation voltage.

Figure 6:
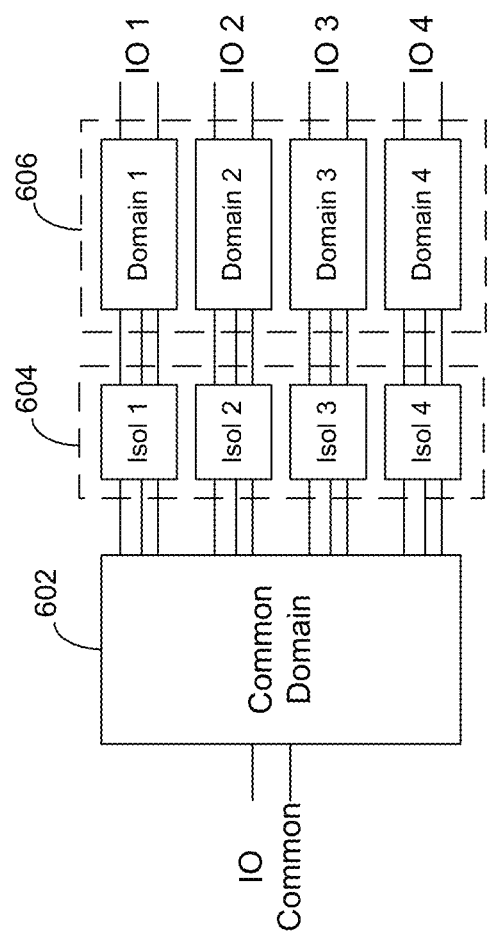

FIG. 6 is a schematic block diagram of an isolation device having a one-to-many and/or many-to-one communication topology between mutually isolated galvanic domains. In this topology, one of the domains is a 'common' domain 602 in that it is directly connected (via respective sets of signal coupling elements 604) to each of the other domains 606, such that the other domains 606 can only communicate with each other (if needed) via the common domain 602. This topology is useful in applications in which it is desirable to control and/or monitor mutually isolated functions from a common control interface.

Figure 18:
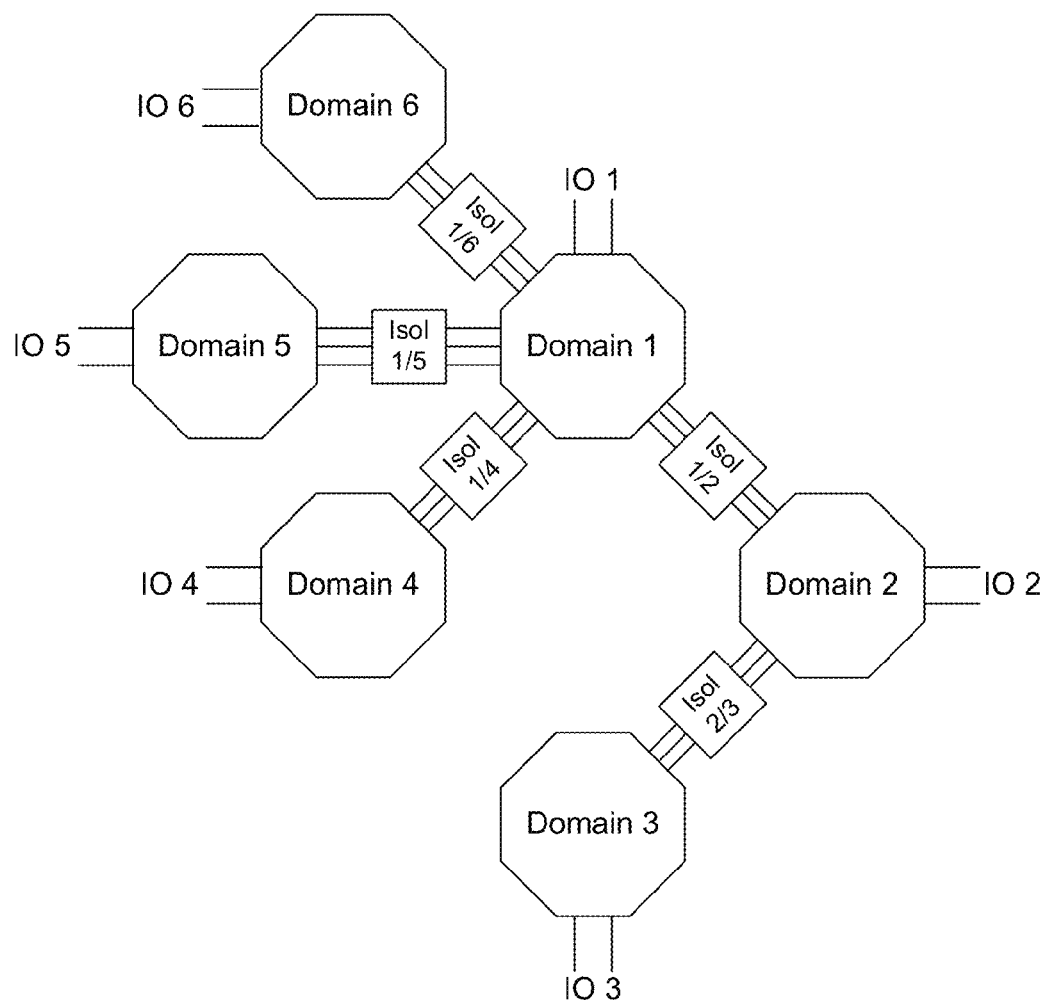
FIG. 18 is a schematic block diagram illustrating a mixed or combination galvanic domain interconnection topology.

The topologies described above can be combined in various ways to form more complex domain communication topologies. For example, FIG. 18 is a schematic block diagram of an isolation device using both the one-to-many and the daisy chain communication topologies described above. Domains 1, 2 and 3 are in a daisy chain arrangement, while domains 1, 4, 5 and 6 are in a one-to-many arrangement. Many other ways of combining the described communication topologies will be readily apparent to those skilled in the art in light of the above disclosure.

Figure 7:
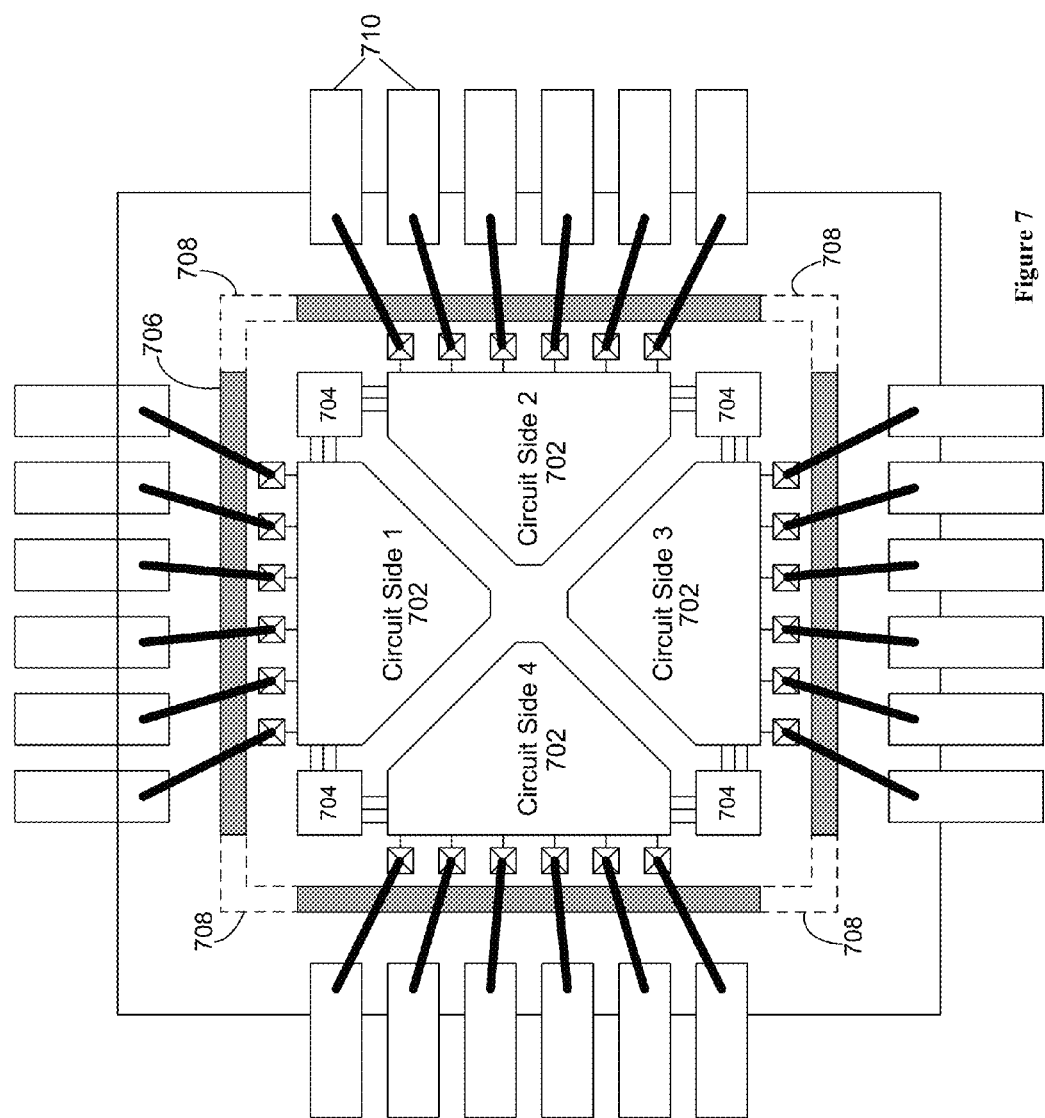
FIG. 7 is a schematic plan view of an integrated circuit die in accordance with one embodiment, having four mutually spaced and mutually isolated integrated circuit domains coupled by four sets of signal coupling elements.

FIG. 7 is a schematic plan view of an isolator integrated circuit die configured to provide the ring communications topology described above and shown schematically in FIG. 5 for four mutually spaced and isolated domains on the die. In this embodiment, each of the four domains 702 is directly coupled to its two closest neighbours by respective sets of signal coupling elements 704 disposed in four corresponding coupling regions.

As shown in FIG. 7, the die in this embodiment has a sealring 706 with four breaks 708 adjacent the respective isolator or signal coupling elements 704. Although these sealring breaks 708 are shown in the four corners of the die, in cases where this reduces production yield (e.g., due to additional stress at die corners), the breaks can be located at locations spaced from the die corners.

The set of package contact pins 710 for each domain 702 are located on a corresponding one of the four sides of the square package, with the pins 702 on each side of the package being spaced away from the package corners in order to increase the distance to the pins 702 on the other sides of the package, thereby increasing the breakdown voltage between the sets of pins 702.

In embodiments with many (e.g., eight or more) mutually isolated domains, it may be impractical to provide breaks in the sealring if there are so many breaks that the sealring cannot effectively fulfil its function. In such embodiments, the die can be provided with a complete (and electrically floating) sealring with no breaks, but with sufficient spacing from the domains and core circuitry to provide the required breakdown strength. Alternatively, if a sealring is not needed for reliability, it can be omitted entirely. Many variations are possible, including the ones described in the single-die isolator patent application.

The communications topologies described herein are applicable to a wide variety of uni- and bi-directional communications, including power, analog and digital signal transmission. There are many devices that can make use of these arrangements, including isolated cross-point switches or routers, isolated banks of relays, and isolated multiplexers.

Device Applications

Application 1: Solid-State Isolated Relays/Switches

The isolation and signal coupling methods and device structures described herein allow banks of isolated relays to be manufactured on a single die, thereby significantly reducing both the space required for such devices and their manufacturing costs. The basic concept is to extend the one-to-many circuit shown in FIG. 6 and add switching functions at each end-point.

Figure 8:
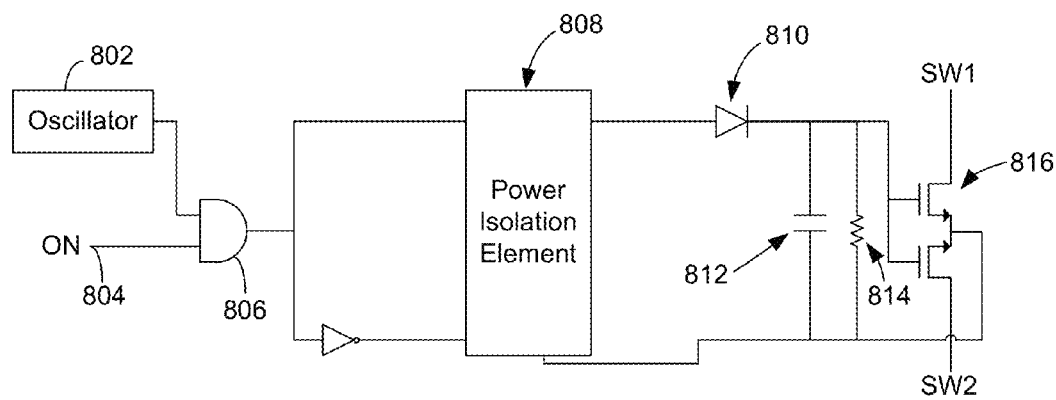
FIGS. 8 and 9 are each a circuit diagram of a single isolated relay/switch or gate driver in accordance with some embodiments of the present invention.

FIG. 8 shows one form of a single isolated relay/switch or gate driver. An oscillator 802 creates a toggling signal that is gated by an input control signal 804. When the input signal 804 is high, an AND gate 806 applies the oscillator output across a galvanic isolation barrier 808, where it is half-wave rectified (via a series diode 810) and smoothed (by a smoothing capacitor 812 in parallel with a resistor 814) and the resulting signal is used to turn on back-to-back transistors 816, thereby turning on the switch/relay and connecting SW1 to SW2 through the transistors 816. Conversely, when the input 804 is low, the control signal across the isolation barrier 808 stops toggling and the resistor 814 discharges the capacitor 812 and hence the gate voltage on the switching transistors 816. The back-to-back transistors 816 allow the SW1 and SW2 voltages to move freely relative to each other in the off state. The back-to-back transistor pair 816 can be replaced by a single transistor in applications where node SW2 is always at a lower potential than node SW1, for example in a high-side or low-side driver. It will be apparent to those skilled in the art that many minor modifications to the circuit of FIG. 8 can be made, such as using full-wave rectification, PFETs instead of NFETs, bipolar transistors instead of FETs, and the like. The switching transistors 816 may be high or low voltage devices, or a stackup of devices. Single or multi-throw versions of the circuit, as well as multiple independent channels, can be implemented without difficulty.

Figure 9:
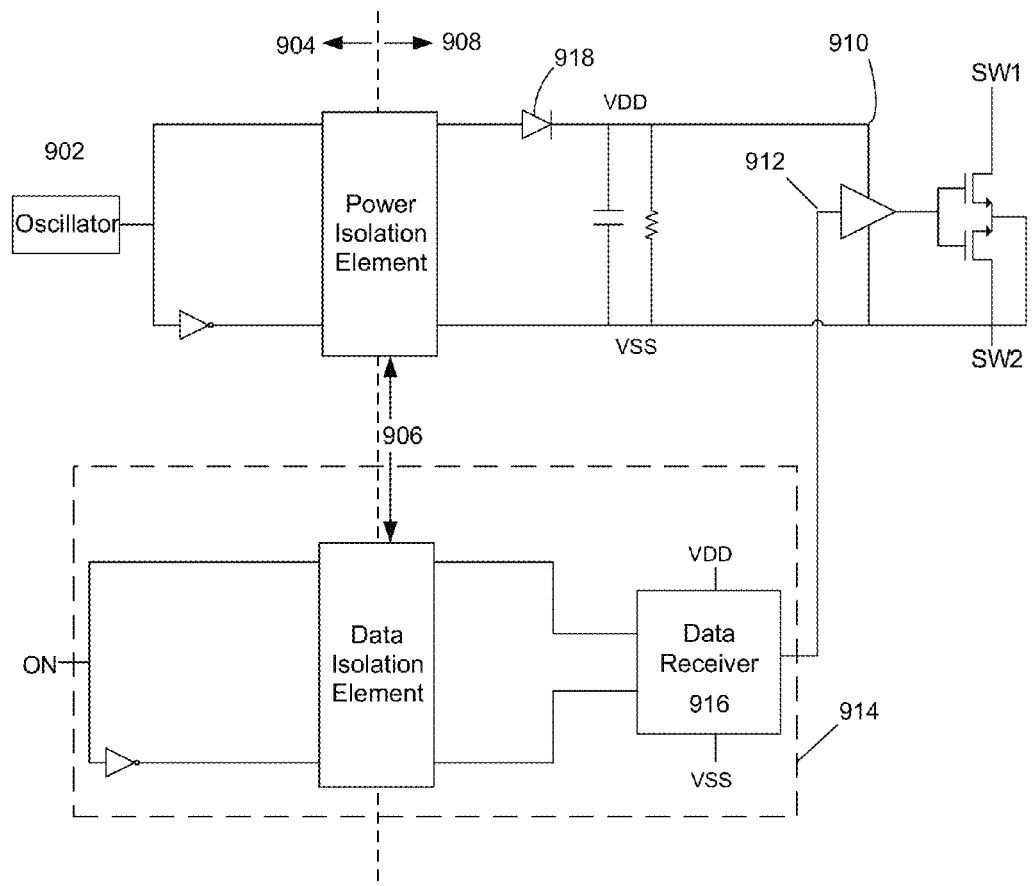

FIG. 9 shows a different form of isolated switch. In this embodiment, an oscillator 902 generates an oscillating signal in a first domain 904 is coupled across a galvanic isolation barrier 906 to a second domain 908 and is then rectified and smoothed as described above to generate a local floating supply rail 910 for the switch. A separate control signal 912 is sent from the first domain 904 across the galvanic isolation barrier 906 to the switch via a data isolator circuit 914 and is used to control the switch gate voltage. The receiver part 916 of the data isolator is itself powered by the floating supply rail 910. The oscillator 902 and control signal transmitter are both in the first domain 904, while the rectifier 918, switch and data receiver are in the second domain 908. This general form of isolated switch is useful where the switch needs to be switched on and off quickly. It is also useful for banks of switches that do not necessarily have to be isolated from each other. As in the example in FIG. 8, many variations on the rectification scheme and the switching device will be apparent to those skilled in the art.

Figure 19:
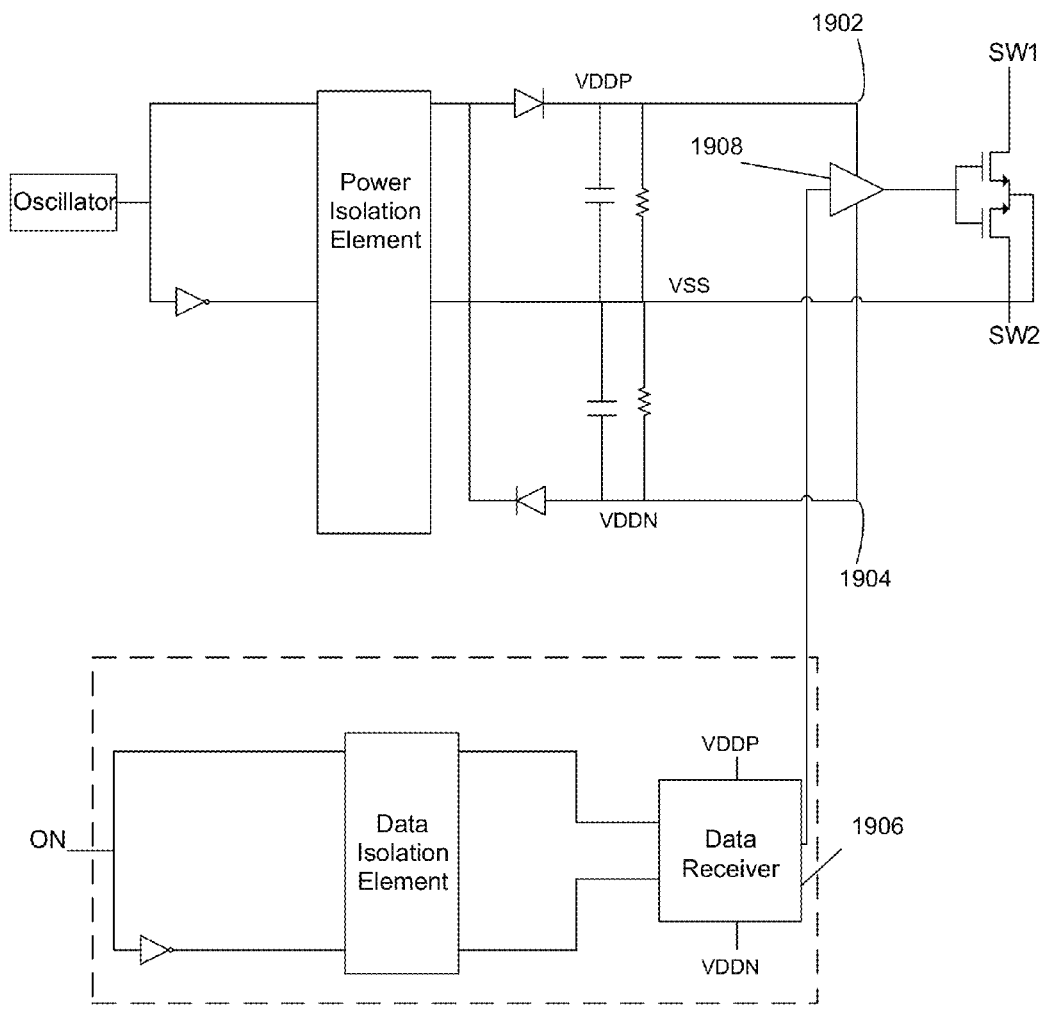
FIG. 19 is a circuit diagram of a single isolated relay/switch or gate driver in accordance with an embodiment of the present invention.

FIG. 19 shows a form of isolated switch similar to that of FIG. 9, but wherein the switch gate voltage is selectively switched to a local positive floating supply 1902 to turn the switch on, and to a local negative floating supply 1904 to turn the switch off. The positive and negative floating supplies 1902, 1904 are both generated by appropriate rectification and smoothing of the isolated oscillator signal as generally described above. The isolated data receiver 1906 and the switch driver 1908 are both powered by the floating positive and negative supplies 1902 and 1904 respectively. This form of isolated switch is suitable where a zero gate voltage is incapable of completely turning the transistor switch off. Examples of such switches include various types of silicon and compound-semiconductor devices such as JFETs and depletion mode FETs. The floating supply rail voltages do not necessarily have to be equal in magnitude—they may be set independently as required by the switching device. Many variations on these rectification schemes will be apparent to those skilled in the art, including bridge-rectification and voltage doubling, for example.

While FIGS. 8, 9 and 19 show simple rectification, it will be will be apparent to those skilled in the art that the addition of voltage regulation circuits to control the voltage or voltages applied to the gate of the switching device may be desirable for some applications.

Figure 10:
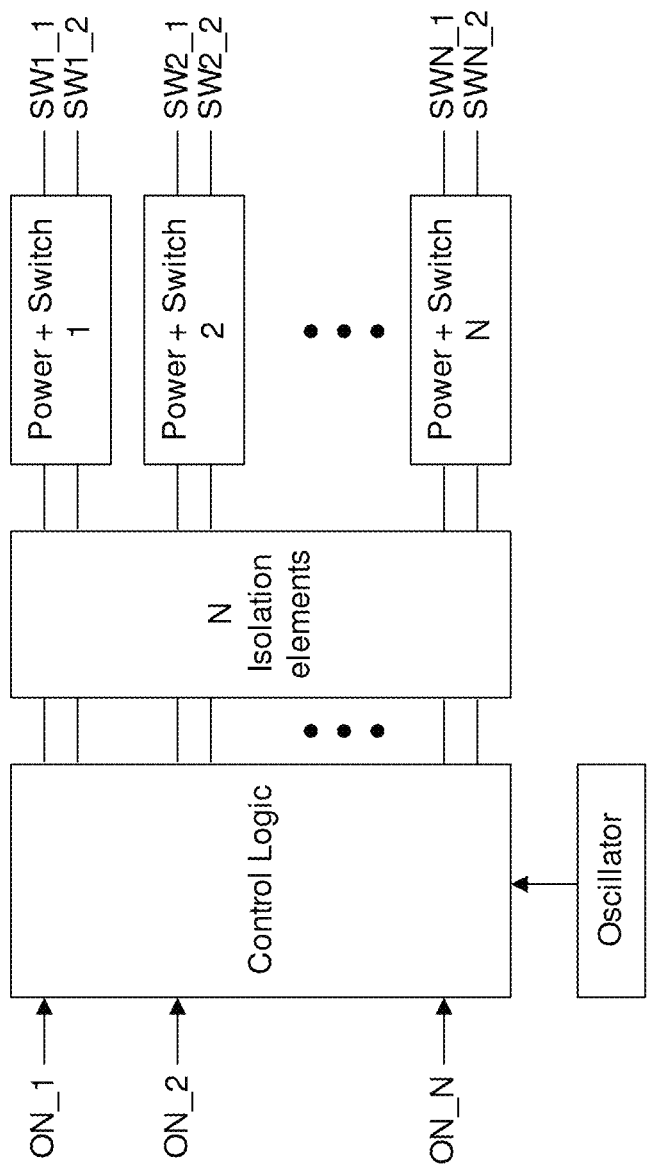
FIG. 10 is a schematic block diagram of a device providing a bank of the single switches of FIG. 8 or FIG. 9.

FIG. 10 is a schematic block diagram of a bank of N isolated switches/relays or gate drivers on a single die using N instances of the general isolated switch/relay structure shown in FIG. 8 or FIG. 9. Notably, these switches are not only isolated from the digital control lines, but also from each other. A common application of the resulting isolation achieved by this circuit is a high side/low side driver (i.e., N=2). In the special case where the low-side output shares the same ground as the digital controls (which is commonly the case in practice), it is not necessary to isolate the low-side output, with the consequence that only two mutually isolated domains are required on the die.

Application 2: Isolated Multiplexer/Cross-Point Switch

Figure 11:
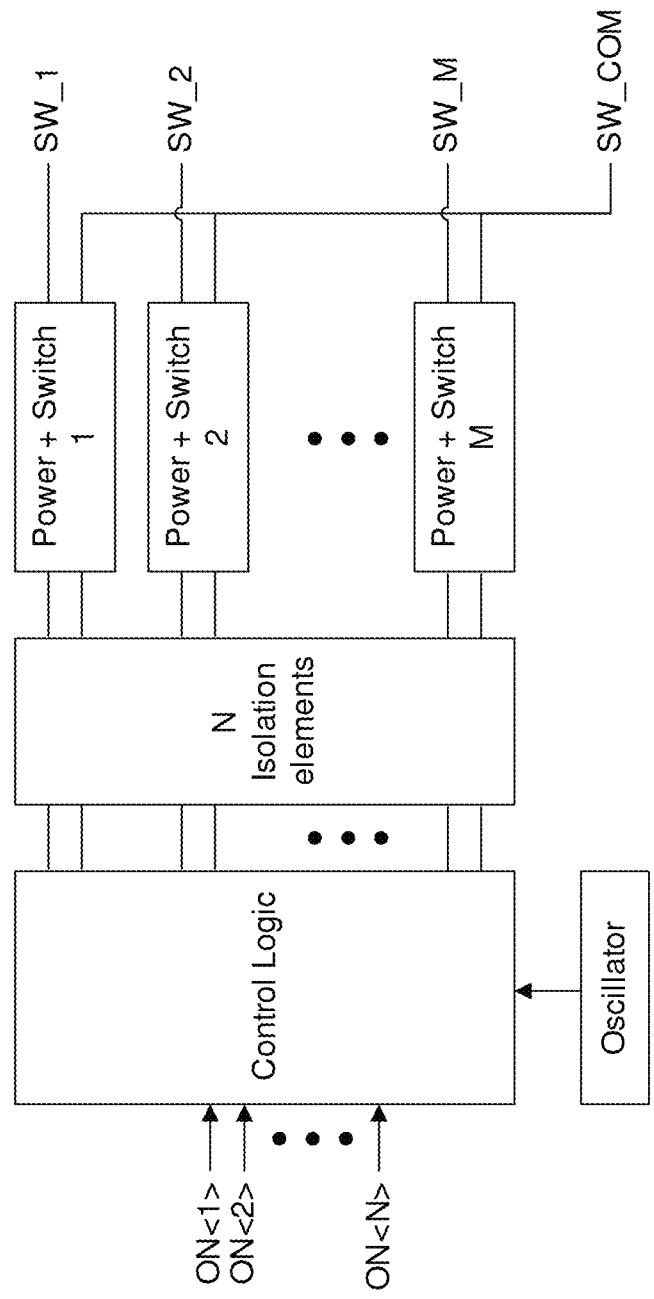
FIG. 11 is a schematic block diagram of an isolated multiplexor device.

An isolated multiplexer is a bank of solid-state isolated switches with one connection in common. An example is shown in FIG. 11, wherein N digital control lines are used to connect one of M terminals (SW_1 . . . SW_M) to a common terminal SW_COM. In a binary coding scheme, M=$2^N$, although other arrangements are also possible. Multi-pole and multi-throw switch arrangements are possible. The advantage of this arrangement is that, in addition to the isolation from the digital controls, the supply and ground pins at the switching side can be eliminated (as described above for Application 1), unlike the high-voltage solid-state multiplexers that are currently available in the market.

Figure 12:
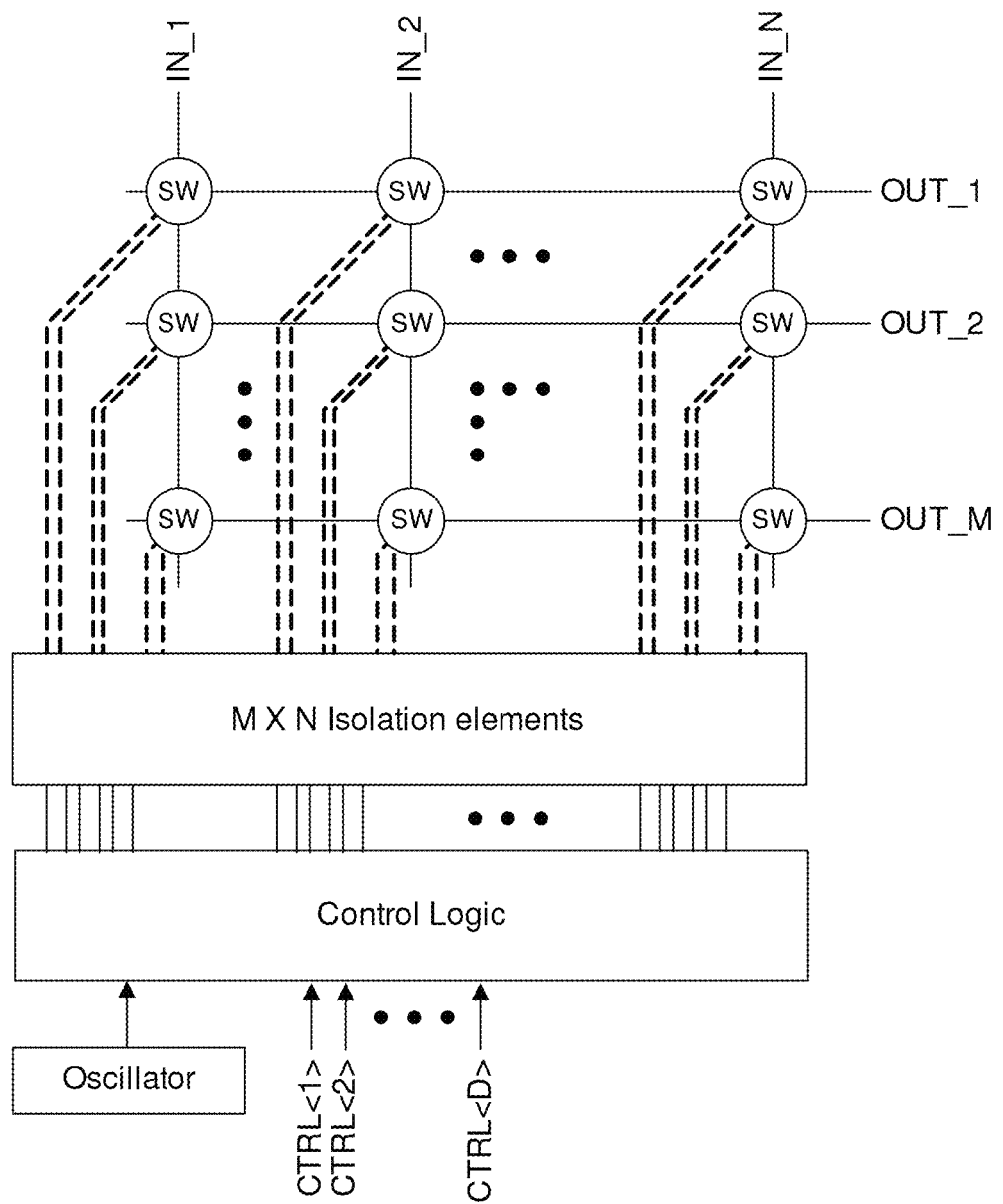
FIG. 12 is a schematic block diagram of an isolated cross-point or crossbar switch matrix.

Finally, FIG. 12 is a schematic block diagram of an isolated cross-point or crossbar switch matrix, in which a set of D digital control lines is used to select rectifier/switch combinations at the intersections of N input and M output lines.

As will be apparent to those skilled in the art in light of this disclosure, multi-pole and multi-throw switches and more generalised switching matrices can also be realised using the methods and structures described herein.

Many modifications will be apparent to those skilled in the art without departing from the scope of the present invention.

The invention claimed is:

1. A galvanic isolation device, including:
    a single die including an electrically insulating substrate and at least three galvanic domains containing respective portions of an integrated circuit, the at least three galvanic domains being mutually galvanically isolated and mutually spaced on the electrically insulating substrate; and
    signal coupling structures on the die to allow communication of signals between the at least three portions of the integrated circuit while maintaining the galvanic isolation therebetween.

2. The galvanic isolation device of claim 1, wherein each of the integrated circuit portions is directly coupled to each of the other integrated circuit portions via a corresponding set of the signal coupling structures and a corresponding dedicated set of interconnect paths.

3. The galvanic isolation device of claim 1, wherein each of the integrated circuit portions is directly coupled to each of the other integrated circuit portions via a corresponding dedicated set of the signal coupling structures and a common set of interconnect paths shared by the other integrated circuit portions.

4. The galvanic isolation device of claim 1, wherein each of the integrated circuit portions is directly coupled to up to two of the other integrated circuit portions via respective dedicated sets of the signal coupling structures and respective dedicated sets of interconnect paths to form a chain or ring of isolated integrated circuit portions.

5. The galvanic isolation device of claim 1, wherein the portions of the integrated circuit include at least two of:
    (i) first integrated circuit portions directly coupled to each of a plurality of other first ones of integrated circuit portions via a corresponding set of the signal coupling structures and a corresponding dedicated set of interconnect paths; and
    (ii) second integrated circuit portions directly coupled to each of a plurality of other second ones of the integrated circuit portions via a corresponding dedicated set of the signal coupling structures and a common set of interconnect paths shared by the other second ones of the integrated circuit portions; and
    (iii) third integrated circuit portions directly coupled to each of a plurality of other third ones of the integrated circuit portions via a corresponding dedicated set of the signal coupling structures and a common set of interconnect paths shared by the other third ones of the integrated circuit portions.

6. The galvanic isolation device of claim 5, wherein the portions of the integrated circuit include all three of (i), (ii), and (iii).

7. The galvanic isolation device of claim 1, wherein the integrated circuit includes a demultiplexer having one input and a plurality of outputs corresponding to ones of the portions of the integrated circuit, each of the outputs being galvanically isolated from the input and the other outputs.

8. The galvanic isolation device of claim 1, wherein the integrated circuit includes a multiplexer configured having one output and a plurality of inputs corresponding to ones of the portions of the integrated circuit, each of the inputs being galvanically isolated from the output and the other inputs.

9. A galvanic isolation device for isolated switching, including:

a single die including an electrically insulating substrate and galvanic domains containing respective portions of an integrated circuit, the galvanic domains being mutually galvanically isolated and mutually spaced on the electrically insulating substrate; and signal coupling structures on the die to allow communication of signals between the portions of the integrated circuit while maintaining the galvanic isolation therebetween;

wherein the portions of the integrated circuit include at least one control integrated circuit portion configured to apply an oscillating differential signal to a corresponding one of the signal coupling structures, depending on the state of a corresponding input signal; and the portions of the integrated circuit include at least one switching integrated circuit portion configured to receive the oscillating differential signal via the corresponding signal coupling structure, to rectify the oscillating differential signal, and to selectively apply the rectified signal, or a signal derived therefrom, to a corresponding gate connection of at least one corresponding transistor such that terminals of the at least one corresponding transistor can be selectively interconnected based on the state of the corresponding input signal.

10. A galvanic isolation device for galvanically isolated switching, including: a single die including an electrically insulating substrate and galvanic domains containing respective portions of an integrated circuit, the galvanic domains being mutually galvanically isolated; and signal coupling structures on the die to allow communication of signals between the portions of the integrated circuit while maintaining the galvanic isolation therebetween;

wherein the portions of the integrated circuit include at least one control integrated circuit portion configured to apply an oscillating differential signal to a corresponding first of the signal coupling structures, and an input signal to a corresponding second of the signal coupling structures; and the portions of the integrated circuit include at least one switching integrated circuit portion configured to receive the oscillating differential signal via the first corresponding signal coupling structure, and to rectify the oscillating differential signal to provide a local floating supply rail; and the switching integrated circuit portion is configured to receive the corresponding input signal via the corresponding second signal coupling structure, to convert the corresponding input signal to a corresponding digital control signal on the local floating supply rail, and to selectively apply the corresponding digital control signal to a gate connection of at least one corresponding transistor such that terminals of the at least one corresponding transistor can be selectively interconnected based on the state of the corresponding input signal.

11. The galvanic isolation device of claim 10, wherein the at least one switching integrated circuit portion is configured to rectify the oscillating differential signal to generate positive and negative local floating supply rails; and the switching integrated circuit portion is configured to selectively convert one of the local floating supply rails to the corresponding digital control signal based on the corresponding input signal.

12. The galvanic isolation device of claim 9, wherein a plurality of mutually isolated switching integrated circuit portions are communicatively coupled to a common control integrated circuit portion to form a bank of isolated switches or relays with a common control interface.

13. The galvanic isolation device of claim 12, wherein at least two of the switches share a common connection.

14. The galvanic isolation device of claim 9, wherein the portions of the integrated circuit and signal coupling structures are configured to provide an M×N isolated crossbar switch.

15. The galvanic isolation device of claim 9, wherein the portions of the integrated circuit and signal coupling structures are configured to provide a high potential domain/low potential domain switch or gate driver under control of signals input to a digital control domain.

16. The galvanic isolation device of claim 15, wherein the low potential domain and the digital control domain are mutually isolated.

17. The galvanic isolation device of claim 15, wherein the low potential side and the digital control domain are the same.

18. The galvanic isolation device of claim 1, wherein the signal coupling structures include capacitive signal coupling structures.

19. The galvanic isolation device of claim 1, wherein the signal coupling structures include inductive signal coupling structures.

20. The galvanic isolation device of claim 1, wherein the signal coupling structures include GMR signal coupling structures.

21. A method of producing a galvanic isolation device, including:

providing an electrically insulating substrate having a plurality of layers thereon, the layers including metal and dielectric layers and at least one semiconductor layer;

patterning at least some of the layers to form at least three mutually galvanically isolated galvanic domains mutually spaced on the substrate; and forming an integrated circuit such that the at least three galvanic domains contain respective portions of the integrated circuit, and the integrated circuit includes signal coupling structures to couple signals between the otherwise mutually galvanically isolated portions of the integrated circuit.

22. A method of producing a galvanic isolation device for galvanically isolated switching, including:

providing an electrically insulating substrate having a plurality of layers thereon, the layers including metal and dielectric layers and at least one semiconductor layer;

patterning at least some of the layers to form at least three mutually galvanically isolated galvanic domains mutually spaced on the substrate; and forming an integrated circuit such that the at least three galvanic domains contain respective portions of the integrated circuit, and the integrated circuit includes signal coupling structures to couple signals between the otherwise mutually galvanically isolated integrated circuit portions, wherein the integrated circuit portions include at least one control integrated circuit portion configured to apply an oscillating differential signal to a corresponding one of the signal coupling structures, depending on the state of a corresponding input signal; and the portions of the integrated circuit include at least one switching integrated circuit portion configured to receive the oscillating differential signal via the corresponding signal coupling structure, to rectify the oscillating differential signal, and to selectively apply the rectified signal, or a signal derived therefrom, to a corresponding gate connection of at least one corresponding transistor such that terminals of the at least one corresponding transistor can be selectively interconnected based on the state of the corresponding input signal.

23. A method of producing a galvanic isolation device for galvanically isolated switching, including:

providing an electrically insulating substrate having a plurality of layers thereon, the layers including metal and dielectric layers and at least one semiconductor layer;

patterning at least some of the layers to form more than two mutually galvanically isolated galvanic domains mutually spaced on the substrate; and forming an integrated circuit such that the more than two galvanic domains contain respective portions of the integrated circuit, the integrated circuit including signal coupling structures to couple signals between the otherwise mutually galvanically isolated portions of the integrated circuit;

wherein the portions of the integrated circuit include at least one control integrated circuit portion configured to apply an oscillating differential signal to a corresponding first of the signal coupling structures, and an input signal to a corresponding second of the signal coupling structures; and the portions of the integrated circuit include at least one switching integrated circuit portion configured to receive the oscillating differential signal via the first corresponding signal coupling structure, and to rectify the oscillating differential signal to provide a local floating supply rail; and the switching integrated circuit portion is configured to receive the corresponding input signal via the corresponding second signal coupling structure, to convert the corresponding input signal to a corresponding digital control signal on the local floating supply rail, and to selectively apply the corresponding digital control signal to the gate connection of at least one corresponding transistor such that terminals of the at least one corresponding transistor can be selectively interconnected based on the state of the corresponding input signal.

* * * * *